US006780766B2

(12) United States Patent
Basceri et al.

(10) Patent No.: US 6,780,766 B2
(45) Date of Patent: Aug. 24, 2004

(54) METHODS OF FORMING REGIONS OF DIFFERING COMPOSITION OVER A SUBSTRATE

(75) Inventors: Cem Basceri, Boise, ID (US); Garo J. Derderian, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/443,354

(22) Filed: May 21, 2003

(65) Prior Publication Data

US 2004/0110360 A1 Jun. 10, 2004

Related U.S. Application Data

(60) Continuation-in-part of application No. 10/243,386, filed on Sep. 13, 2002, which is a division of application No. 09/827,759, filed on Apr. 6, 2001, now Pat. No. 6,511,896.

(51) Int. Cl.[7] .............................................. H01L 21/44
(52) U.S. Cl. ...................................................... 438/676
(58) Field of Search ................................. 438/676, 683, 438/738, 795

(56) References Cited

U.S. PATENT DOCUMENTS

| 4,450,041 | A | * | 5/1984 | Aklufi ........................ 216/87 |
| 5,292,673 | A | | 3/1994 | Shinriki et al. |
| 5,486,488 | A | | 1/1996 | Kamiyama |
| 5,641,702 | A | | 6/1997 | Imai et al. |
| 5,726,083 | A | | 3/1998 | Takaishi |
| 5,893,734 | A | | 4/1999 | Jeng et al. |
| 6,117,725 | A | | 9/2000 | Huang |
| 6,200,893 | B1 | | 3/2001 | Sneh |
| 6,235,572 | B1 | | 5/2001 | Kunitomo et al. |
| 6,399,438 | B2 | | 6/2002 | Saito et al. |
| 6,511,896 | B2 | | 1/2003 | Basceri et al. |

OTHER PUBLICATIONS

Bin Yu, et al., "70nm MOSFET with Ultra–Shallow, Abrupt, and Super–Doped S./D Extension Implemented by Laser Thermal Process (LTP)", IEEE, Mar. 1999.

Somit Talwar, et al., "Ultra–Shallow, Abrupt, and Highly–Activated Junctions by Low–Energy Ion Implantation and Laser Annealing", Verdant Technologies, San Jose, CA.

Ken–ichi Goto, et al., "Ultra–Low Contact Resistance for Deca–nm MOSFETs by Laser Annealing", IEEE, Sep. 1999, pp. 20.7.1–20.7.3.

* cited by examiner

Primary Examiner—David Nelms
Assistant Examiner—Quoc Hoang
(74) Attorney, Agent, or Firm—Wells St. Jonh P.S.

(57) ABSTRACT

The invention includes methods of forming regions of differing composition over a substrate. A first material having a pattern of at least one substantially amorphous region and at least one substantially crystalline region is provided over the substrate. The at least one substantially amorphous region of the first material replaced with a second material, while the at least one substantially crystaline region is not replaced. The invention also includes a circuit construction comprising an electrically conductive material extending within openings in a substantially crystalline electrically insulative material, and in which the electrically conductive material corresponds to quantum dots.

39 Claims, 6 Drawing Sheets

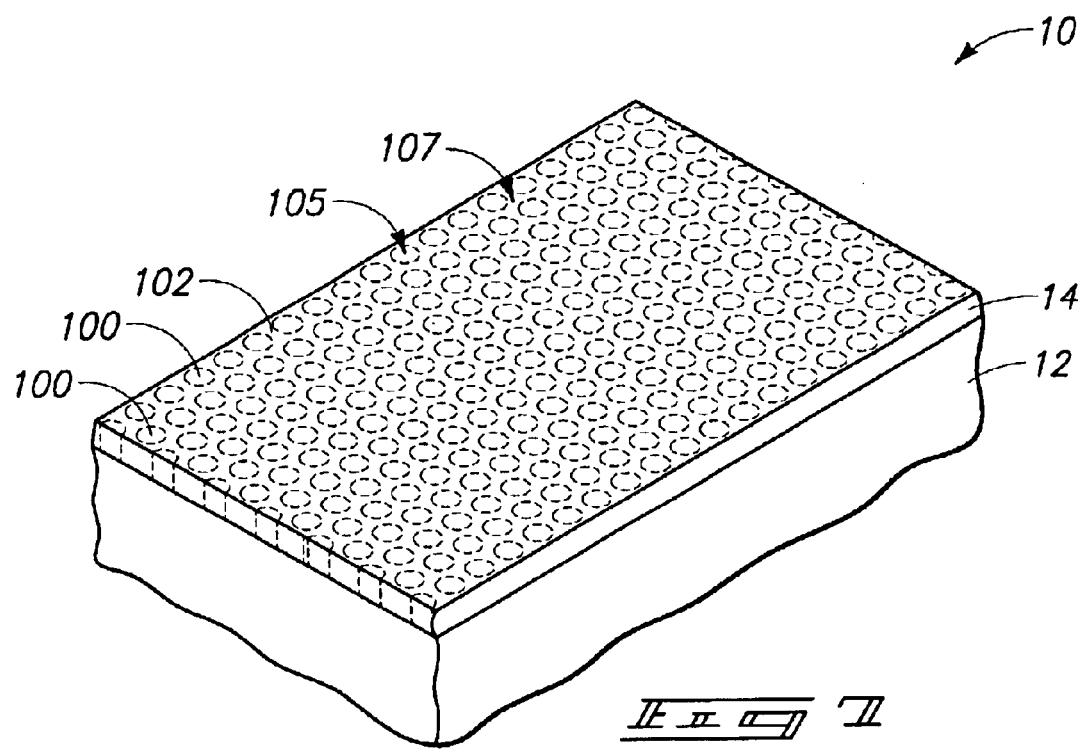
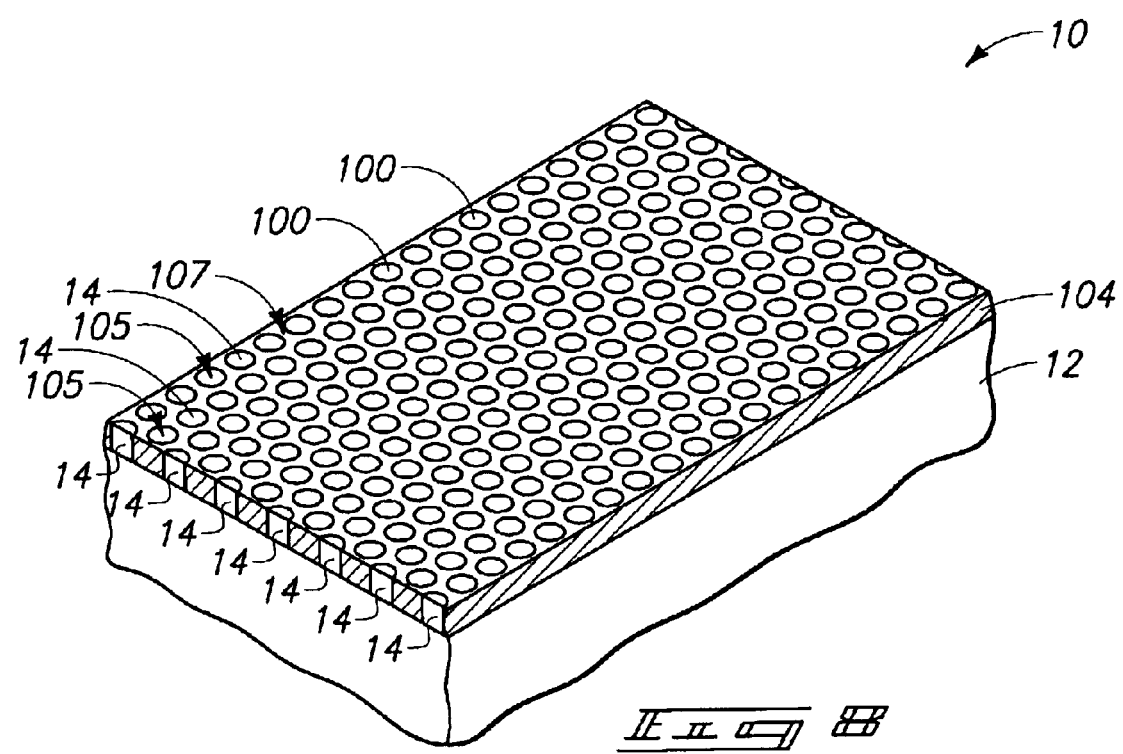

METHODS OF FORMING REGIONS OF DIFFERING COMPOSITION OVER A SUBSTRATE

RELATED PATENT DATA

This patent is a continuation-in-part application of U.S. patent application Ser. No. 10/243,386, filed Sep. 13, 2002; which is a divisional application of U.S. patent application Ser. No. 09/827,759, filed Apr. 6, 2001 and now U.S. Pat. No. 6,511,896.

TECHNICAL FIELD

The invention pertains to circuit constructions comprising quantum dots and/or quantum anti-dots, and also pertains to methods of forming regions of differing composition over substrates.

BACKGROUND OF THE INVENTION

Nanodevices are structures having dimensions measured in nanometers. Nanotechnology is a field associated with formation of nanodevices, and is a growing field expected to make significant impacts in diverse subject areas, including, for example, biology, chemistry, computer science and electronics.

Nanodevices include, for example, quantum dots and anti-dots. A quantum dot is a particle of matter in which addition or removal of an electron changes its properties in some useful way.

Quantum dots and anti-dots can have numerous applications. For instance, quantum dots and anti-dots can significantly increase the density of electronic devices, which can increase performance of the devices. Quantum dots and anti-dots may be particularly useful in high-density memory and storage media. Specifically, a quantum dot or anti-dot can be incorporated into data storage devices. If the position of an electron within a quantum dot or anti-dot changes a state of the dot or anti-dot, the quantum dot or anti-dot can represent a byte of data.

Although various techniques have been developed for forming nanodevices, there remains a need to develop methodologies which can enable large-scale fabrication of the devices. Accordingly, it is desirable to develop new techniques for fabrication of nanodevices.

Another aspect of the prior art is that it is frequently desirable to form specific patterns of materials over substrates. Photolithography is commonly utilized to form the patterns, but photolithography has limitations imposed by, among other things, the wavelength of light utilized, which limits the minimum feature size which can be formed with photolithographic processing. Accordingly, it is desired to develop new methods which can be utilized for forming patterns of materials, and it is particularly desired to develop new methods which can be utilized to form features having smaller dimensions than can be practically formed with photolithography.

SUMMARY OF THE INVENTION

In one aspect, the invention encompasses a circuit construction. The construction comprises a substrate and a substantially crystalline electrically insulative material over the substrate. A plurality of openings extend within the substantially crystalline electrically insulative material, and an electrically conductive material is within the openings and corresponds to quantum dots.

In one aspect, the invention encompasses methods of forming regions of differing composition over a substrate. A material is formed over the substrate. A pattern of at least one substantially amorphous region and at least one substantially crystalline region is formed within the material. The material has a first composition. The at least one substantially crystalline region defines at least one first region over the substrate, and the at least one substantially amorphous region defines at least one second region over the substrate. The at least one substantially amorphous region is selectively replaced relative to the at least one substantially crystalline region of the material, and is replaced with a second composition which is different from the first composition. After the selective replacement of the at least one substantially amorphous region of the material, the defined at least one first region has the first composition and the defined at least one second region has the second composition.

BRIEF DESCRIPTION OF THE DRAWINGS

Preferred embodiments of the invention are described below with reference to the following accompanying drawings.

FIG. 7 is a view of the FIG. 1 wafer fragment shown at a processing stage subsequent to that of FIG. 1 in accordance with a second exemplary aspect of the present invention.

FIG. 8 is a view of the FIG. 1 wafer fragment shown at a processing stage subsequent to that of FIG. 7.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

One aspect of the present invention is a recognition that selective exchange can occur between a metal-containing fluid (typically a gas) and suitable amorphous materials to replace the materials with a composition comprising metal from the fluid. The chemical reaction can be selective for an amorphous form of a material relative to a crystalline form of the material. Accordingly, if a suitable material is provided to have both amorphous regions and crystalline regions, and is subsequently exposed to a metal-containing gas, the amorphous regions will be replaced with a metal-containing region comprising metal from the gas, and the crystalline regions will not be replaced. Particular aspects of the invention take advantage of such selectivity to form patterns without utilization of photomasking materials (such as, for example, photoresist). In other words, the selectivity is utilized to develop new patterning methods, which can be used alternatively, and/or additionally, to traditional photolithographic patterning methods. In particular aspects, the new patterning methods are utilized to form nanodevices, such as, for example, quantum dots and anti-dots.

Figure 1:
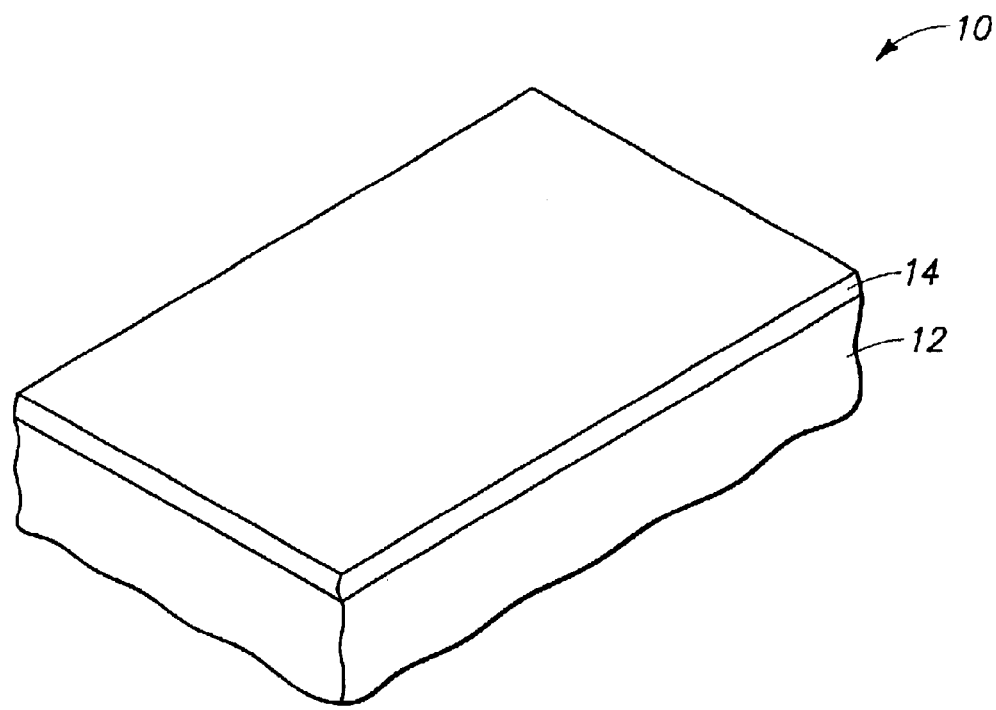
FIG. 1 is a diagrammatic, isometric view of a fragment of a semiconductor wafer shown at a preliminary processing stage of an exemplary aspect of the present invention.

An exemplary aspect of the invention is described with reference to FIGS. 1–6. Referring initially to FIG. 1, a fragment 10 of a semiconductor wafer construction is illustrated.

Fragment 10 comprises a substrate 12. The substrate can comprise, consist essentially of, or consist of monocrystalline silicon in various aspects of the invention. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

A layer 14 is formed over substrate 12. Layer 14 is preferably in an amorphous form, and in particular aspects can be entirely in an amorphous form. The term "substantially amorphous" is utilized to indicate that the amorphous character of a material is sufficient to allow the material to be distinguished on the basis of a lack of crystallinity in processing described below where substantially amorphous regions are selectively replaced relative to substantially crystalline regions. The term "substantially amorphous" thus encompasses materials having a high degree of amorphous character (such as, for example, materials in which x-ray diffraction or other suitable methods of detecting crystallinity would indicate that there is no detectable crystallinity), including materials which are for all practical purposes entirely amorphous, as well as encompassing materials which are detectably less than entirely amorphous. Typically, a substantially amorphous material will be at least 95% (by volume) amorphous, and accordingly will be less than or equal to 5% (by volume) crystalline.

Material 14 comprises a composition, and for purposes of distinguishing the composition of material 14 from other compositions described subsequently in this disclosure, the composition of material 14 can be referred to as a first composition. The composition of material 14 can comprise, consist essentially of, or consist of any material suitable for the processing of this disclosure, including, for example, tantalum pentoxide ($Ta_2O_5$), tantalum nitride ($TaN_x$, where x is greater than 0), and aluminum oxide ($Al_2O_3$).

Layer 14 can be formed to any suitable thickness, and in particular aspects, will be formed to a thickness of from about 5Å to about 500Å.

If layer 14 comprises tantalum pentoxide, such can be formed by, for example, chemical vapor deposition. Exemplary chemical vapor deposition utilizes $Ta(OC_2H_5)_5$ and $O_2$ as precursors at an exemplary susceptor temperature range from about 400° C. to about 550° C., and an exemplary ambient pressure from about 100 mTorr to about 20 Torr.

Figure 2:
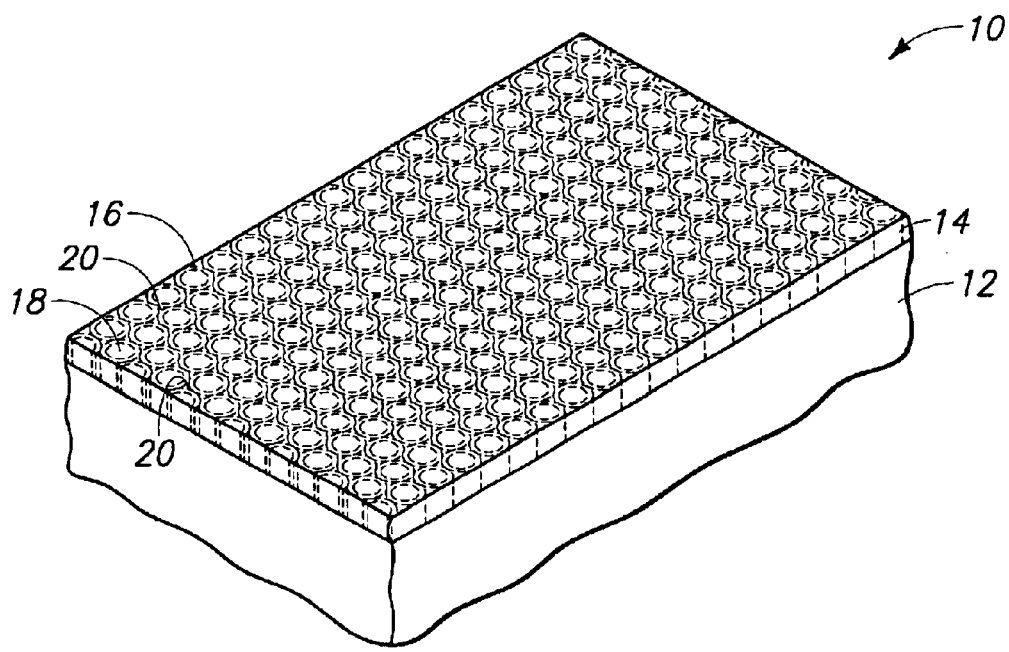
FIG. 2 is view of the FIG. 1 wafer fragment shown at a processing stage subsequent to that of FIG. 1.

Referring next to FIG. 2, selected regions of layer 14 are exposed to energy to convert the selected regions from the substantially amorphous form of material 14 to a substantially crystalline form. In the shown aspect of the invention, the selected regions which are converted to the crystalline form correspond to rings 16 (only one of which is labeled). Each of the rings 16 surrounds an island 18 (only one of which is labeled) of the material 14 remaining in the amorphous form. Since the energy utilized to form the regions 16 of substantially crystalline material forms a pattern of such regions, the energy can be referred to as a pattern of energy.

The illustrated circular rings corresponding to regions 16 are shown to be in a closest-packed configuration. Such can be preferred, as such can maximize the packing density of structures ultimately formed utilizing methodology of the present invention. However, it is to be understood that the invention encompasses other aspects (not shown) in which crystalline regions are formed in patterns which do not correspond to closest-packed configurations of the regions. Also, it is to be understood that the shown circular rings are an exemplary aspect of the invention, and that the crystalline regions can be formed in any suitable shape.

In the shown aspect of the invention, regions 20 (only two of which are labeled) of material 14 occur at interstices of the closest-packed regions 16. Regions 20 correspond to portions of material 14 that are not comprised by the rings 16, and also are not surrounded by a single ring, but instead are between two or more adjacent rings. The regions 20 are initially portions of material 40 in the amorphous form, in that the regions 20 have not been subjected to the crystallization conditions utilized for forming regions 16. In particular aspects of the invention, it can be desired to eliminate regions 20. Such can be accomplished by generating crystalline regions 16 of a suitable shape so that regions 20 do not occur, or can be accomplished by subjecting regions 20 to crystallization conditions before or after generation of regions 16 so that the regions 20 of material 14 ultimately end up in the crystalline form. Regions 20 can be crystallized after formation of rings 16 with, for example, a heated stencil configured to heat regions 20 and thus convert the material 14 of the regions to a crystalline form.

The energy utilized to generate crystalline regions 16 (and which can also be utilized to crystallize regions 20 where so desired) can be, for example, one or both of thermal energy and light. In particular aspects, the crystalline regions are formed by exposure to laser-emitted light, and in other aspects the crystalline regions are formed by exposure to a heated structure. A suitable heated structure is an atomic force microscope tip. In aspects in which the crystalline regions are formed with a heated structure, formation of such crystalline regions can be considered to comprise heating the portions of material 14 which are to be crystallized more than the portions of material 14 which are to remain in the amorphous form.

Crystalline regions 16 can be entirely crystalline, or substantially crystalline, in various aspects of the invention. The term "substantially crystalline" indicates that regions 16 comprise enough crystalline character to be distinguished from substantially amorphous regions in the processing that follows. In other words, the terms "substantially crystalline" and "substantially amorphous" can be considered to be relative terms, with the term "substantially crystalline" indicating more crystalline character than the term "substantially amorphous". The term "substantially crystalline" can, therefore, comprise materials which are entirely crystalline, as well as materials having a form which is less than entirely crystalline. In particular aspects, a "substantially crystalline" material of the present invention can comprise at least 95% (by volume) crystalline phase, and a "substantially amorphous" material of the present invention can comprise at least 95% (by volume) amorphous phase.

Figure 3:
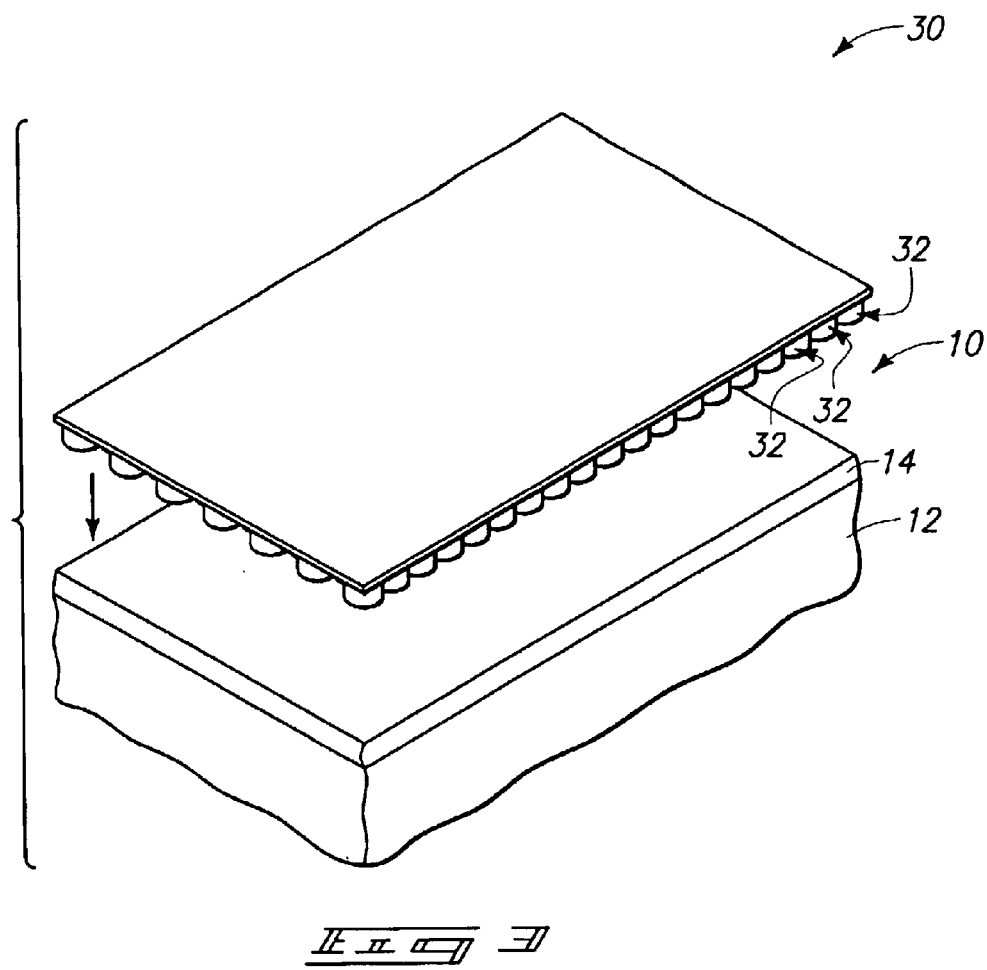
FIG. 3 is a view of the FIG. 1 wafer fragment shown at a processing stage subsequent to that of FIG. 1, and illustrates an exemplary process which can be utilized for forming the FIG. 2 structure.
Figure 4:
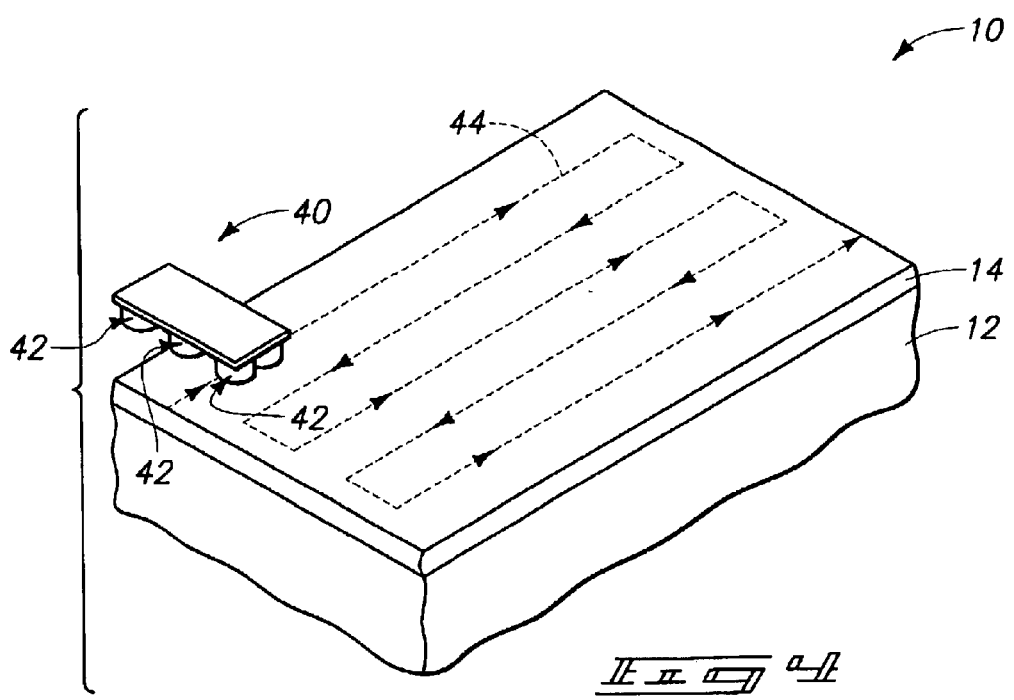
FIG. 4 is a view of the FIG. 1 wafer fragment at a processing stage subsequent to that of FIG. 1, and illustrates another exemplary process that can be utilized for forming the FIG. 2 structure.

FIGS. 3 and 4 illustrate exemplary apparatuses that can be utilized for forming the substantially crystalline regions 16. Referring initially to FIG. 3, structure 10 is shown together with an assembly 30. Assembly 30 comprises a plurality of heated tips 32 (only some of which are labeled) which form an array extending across the entire upper surface of layer 14. Tips 32 can comprise a circular ring suitable for formation of the rings 16 described with reference to FIG. 2. In operation, apparatus 30 can be lowered onto layer 14 so that the heated tips impact regions of layer 14 and thereby form the crystalline regions 16 within material 14.

In another aspect of the invention, apparatus 30 can be replaced with an apparatus suitable for providing patterned laser-emitted light across an entire surface of layer 14. For instance, the heated structures 32 described above can be replaced with light pipes. The laser-emitted radiation can then be utilized for forming the crystalline regions 16 described above with reference to FIG. 2.

FIG. 4 illustrates alternative methodology for forming crystalline regions 16 (FIG. 2). Specifically, construction 10 is shown proximate an assembly 40 comprising heated tips 42 (only some of which are labeled). The number of heated tips 42 of assembly 40 corresponds to a subset of the total number of crystalline regions 16 (FIG. 2) that are ultimately to be generated. In the shown aspect of the invention, such subset is 6 tips, but it is to be understood that less than 6 tips can be utilized (for example, a single tip can be utilized), or more than 6 tips can be utilized. In operation, assembly 40 is rastored relative to an upper surface of material 14 and sequentially utilized to form the crystalline regions 16. An exemplary rastoring pattern 44 is diagrammatically illustrated with a dashed line over an upper surface of layer 14. The heated tips in assembly 40 can be replaced with other structures suitable for forming crystalline region 16. For instance, the heated tips can be replaced with structures suitable for directing laser-emitted light (such as, for example, light pipes), and the laser-emitted light can be utilized for forming a pattern of crystalline regions within material 14.

Figure 5:
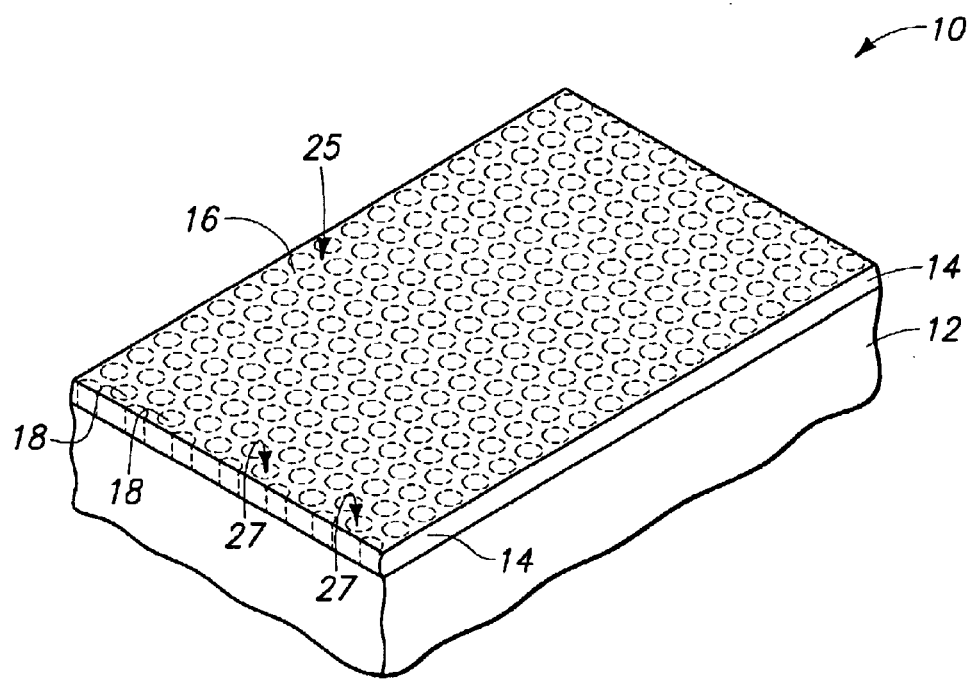
FIG. 5 is a view of the FIG. 1 wafer fragment shown at a processing stage subsequent to that of FIG. 2.

Referring to FIG. 5, construction 10 is illustrated at a processing stage subsequent to that of FIG. 2. The regions 20 (FIG. 2) have been converted to crystalline regions. Removal of regions 20 can be accomplished by, for example, converting regions 20 to crystalline form, so that the regions 16 and 20 together define regions of layer 14 which are in a substantially crystalline form, and accordingly together correspond to the above-described "first regions". Thus, the regions 16 illustrated in FIG. 5 correspond to a merger of the regions 16 and 20 described previously with reference to FIG. 2. The material 14 of FIG. 5 is divided into a pattern containing crystalline region 16 surrounding islands of amorphous regions 18. Although a single crystalline region 16 is shown in FIG. 5, it is to be understood that the invention encompasses other aspects where a plurality of separate crystalline regions are present at the processing stage of FIG. 5.

The differences in crystalline phase between regions 18 and 16 are ultimately utilized to form a conductive composition in a desired pattern over substrate 12. In the discussion that follows, crystalline region 16 can be considered to define a first region 25 over substrate 12, and amorphous regions 18 can be considered to define second regions 27 over the substrate. The defined first and second regions correspond to the locations of regions 16 and 18 in FIG. 5, rather than to the regions 16 and 18 themselves, Referring to FIG. 6, the amorphous regions of material 14 are selectively replaced relative to the crystalline regions. Specifically, amorphous regions 18 (FIG. 5) are replaced with a composition 50 while crystalline regions 16 are not replaced. Composition 50 is thus formed in the second regions 27 and not in the first region 25.

Composition 50 is different from the composition of layer 14, and can be referred to as a second composition to distinguish it from the first composition of layer 14. In particular aspects, composition 50 can be an electrically conductive material, and material 14 can be an electrically insulative material. Accordingly, the islands of composition 50 formed by replacing the amorphous portions of material 14 can correspond to isolated islands of conductive material surrounded by the crystalline insulative material 14 of region 16. In such aspects, amorphous regions 18 (FIG. 5) can be formed to a size suitable for the isolated islands of conductive material 50 to correspond to quantum dots.

In particular aspects, material 14 can consist essentially of, or consist of tantalum pentoxide, and the composition 50 can comprise, consist essentially of, or consist of tungsten or titanium. In other aspects, material 14 can comprise aluminum oxide, and composition 50 can comprise, consist essentially of, or consist of titanium. In yet other aspects, material 14 can consist essentially of, or consist of tantalum nitride, and composition 50 can comprise, consist essentially of, or consist of tungsten or titanium.

In aspects in which composition 14 consists essentially of, or consists tantalum pentoxide, and in which composition 50 comprises tungsten, the selective replacement of amorphous regions of material 14 (i.e., the regions 18 of FIG. 5) with composition 50 while not replacing crystalline portion of material 14 (i.e., the region 16 of FIG. 5) can be accomplished by the following process. The crystalline and amorphous portions of layer 14 can simultaneously be exposed to $WF_6$ while at a temperature of from about 350° C. to about 400° C., and while exposed to a pressure in a range of from about 5 mTorr to about 10 Torr. The $WF_6$ can be combined with, for example, one or more of hydrogen ($H_2$), nitrogen-containing compositions ($NH_3$, $N_2$, $N_2H_2$, or $N_2$ plasma (either remote or within the chamber)), and silicon-containing materials ($SiH_4$, disilane and dichlorosilane). If the gas comprises $WF_6$ and hydrogen, without nitrogen-containing components or silicon-containing components, the composition 50 can consist essentially of, or consist of tungsten. In contrast, if the gas comprises $WF_6$ in combination with nitrogen-containing materials, the composition can comprise tungsten nitride. Alternatively, if the gas comprises $WF_6$ in combination with silicon-containing materials, the composition 50 can comprise tungsten silicide.

Similar conditions to those described above with reference to the tungsten-containing compound $WF_6$ can be utilized with a titanium-containing compound (such as, for example, $TiCl_4$), to form composition 50 comprising, consisting essentially of, or consisting of titanium. Also, conditions similar to those described above for replacement of substantially amorphous tantalum pentoxide selectively relative to substantially crystalline tantalum pentoxide can be utilized for replacing substantially amorphous aluminum oxide selectively relative to substantially crystalline aluminum oxide, or substantially amorphous tantalum nitride relative to substantially crystalline tantalum nitride.

Another aspect of the invention is described with reference to FIGS. 7–12. Referring initially to FIG. 7, construction 10 is shown at a processing stage subsequent to that of FIG. 1. Material 14 has been exposed to patterned energy (such as, for example, a pattern of laser-emitting light, and/or a pattern of heated tips) to form regions 100 having a substantially crystalline form, and to leave the remainder of material 14 in the substantially amorphous form. The portion of material 14 remaining in the substantially amorphous form is labeled as portion 102. The embodiment of FIG. 7 is an a sense an opposite to that described with reference to FIG. 5. Specifically, FIG. 5 had islands of amorphous material (18) surrounded by crystalline material (16), whereas FIG. 7 has islands of crystalline material (100) surrounded by amorphous material (102).

For purposes of the discussion that follows, the locations of crystalline material 100 of FIG. 7 can be defined as first regions 105 over substrate 12, and the location of amorphous material 102 can be defined as a second region 107 over substrate 12. It is noted that regions 105 and 107 correspond to the locations of crystalline material 100 and amorphous material 102 rather than to the crystalline and amorphous materials themselves.

Referring to FIG. 8, the substantially amorphous form of material 14 is selectively replaced with a conductive material 104, while leaving the crystalline form of material 14 (i.e., crystalline regions 100) in the first defined regions 105. The selective replacement of the amorphous form of material 14 relative to the crystalline form of material 14 can be accomplished utilizing methodology described above with reference to FIG. 6. Accordingly, conductive material 104 can comprise, for example, a titanium-containing material or a tungsten-containing material.

Figure 9:
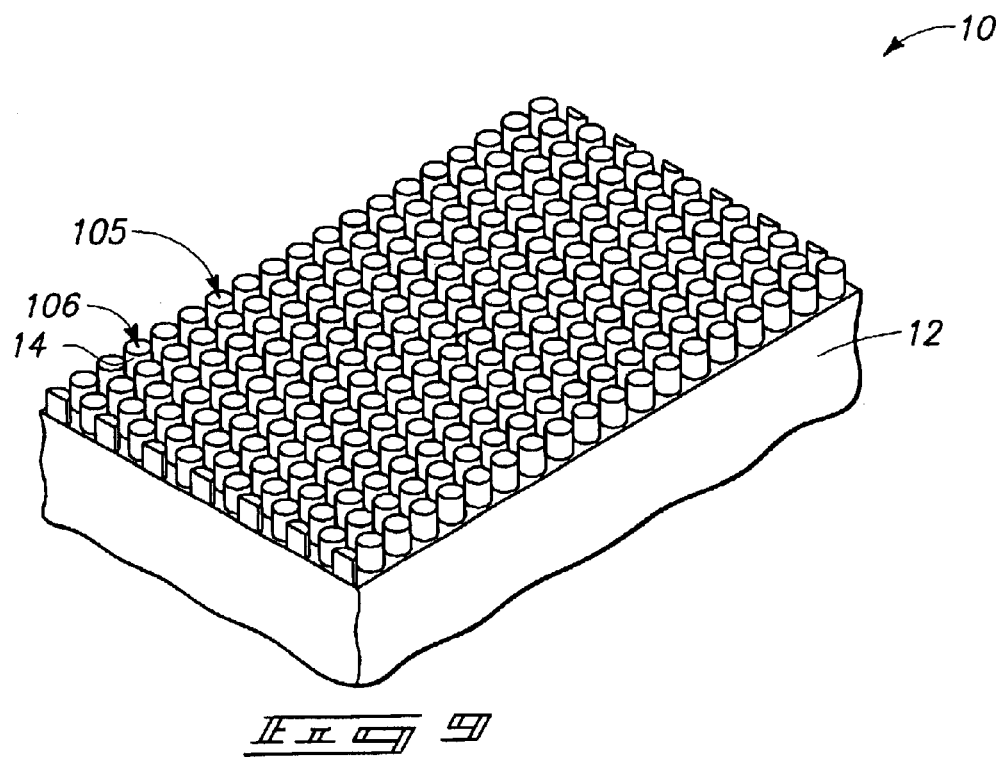
FIG. 9 is a view of the FIG. 1 wafer fragment shown at a processing stage subsequent to that of FIG. 8.

Referring to FIG. 9, material 104 (FIG. 8) is selectively removed relative to material 14 to leave pedestals 106 of material 14 at first defined regions 105.

Figure 10:
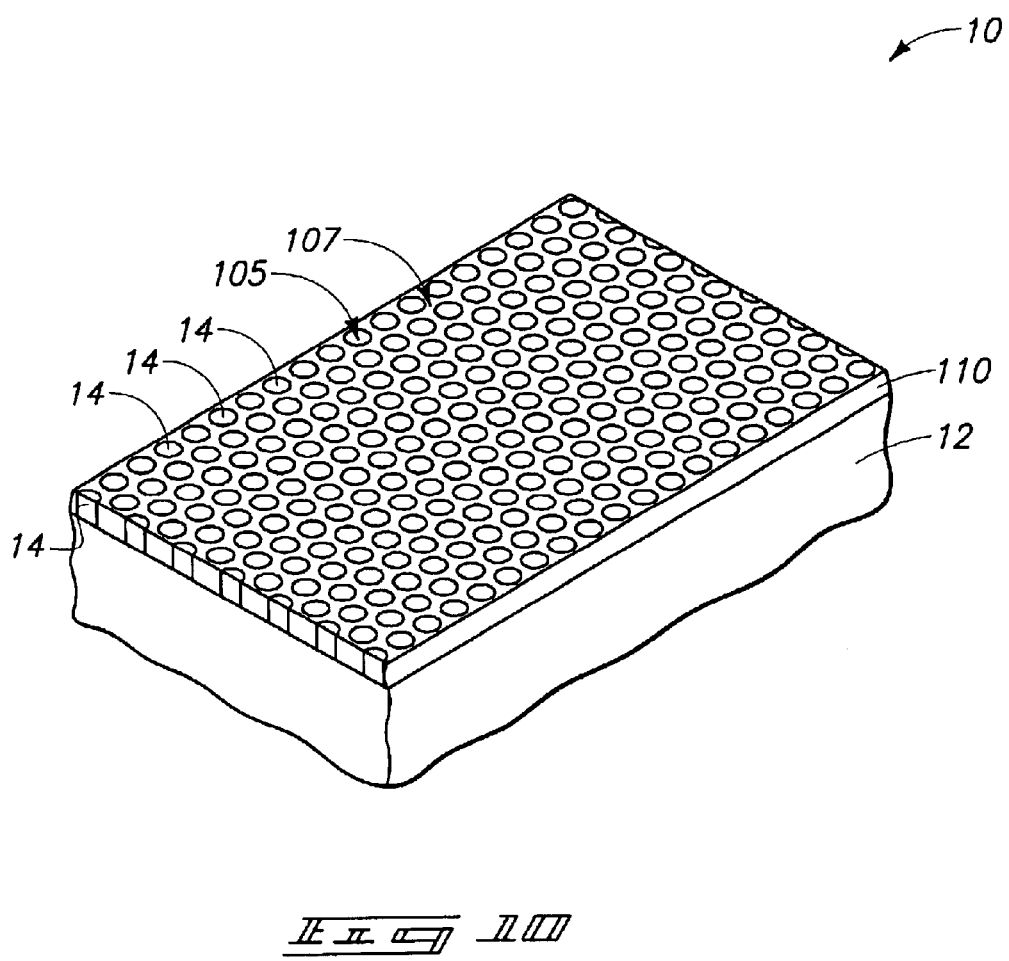
FIG. 10 is a view of the FIG. 1 wafer fragment shown at a processing stage subsequent to that of FIG. 9.
Figure 11:
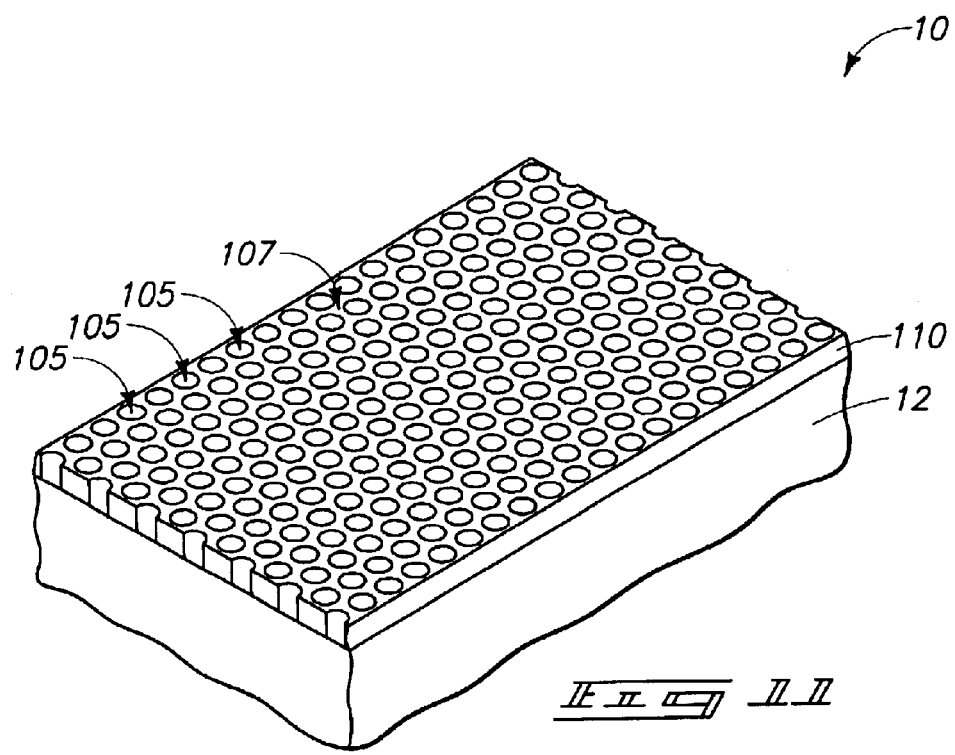
FIG. 11 is a view of the FIG. 1 wafer fragment shown at a processing stage subsequent to that of FIG. 10.

Referring to FIG. 10, an electrically insulative material 110 is formed over substrate 12 and around pedestals 106 (FIG. 9), or in other words is formed at second defined regions 107. Insulative material 110 can be formed by, for example, chemical vapor deposition followed by chemical-mechanical polishing. Material 110 preferably comprises a material different from material 14, and to which material 14 can be selectively removed. For instance, if material 14 comprises tantalum pentoxide, material 110 can comprise borophosphosilicate glass (BPSG), spin-on-glass (SOG) and/or high density plasma (HDP) oxide.

Referring to FIG. 1 1, material 14 (FIG. 10) is selectively removed relative to material 110 to form openings at first defined regions 105.

Figure 12:
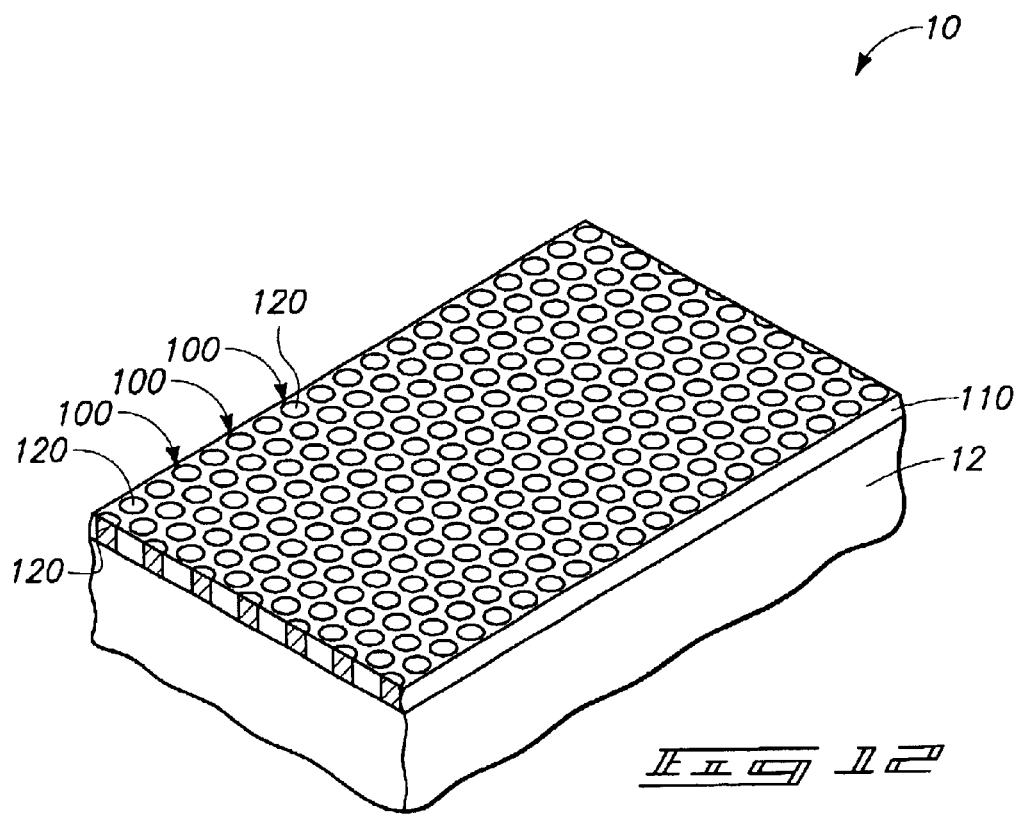
FIG. 12 is a view of the FIG. 1 wafer fragment shown at a processing stage subsequent to that of FIG. 11.

Referring to FIG. 12, the openings at regions 105 are filled with a conductive material 120. Any suitable conductive material can be utilized, with exemplary materials comprising, consisting essentially of, or consisting of titanium and/or tungsten. Material 120 can be formed within the FIG. 10 openings by, for example, chemical vapor deposition, sputter deposition, and/or atomic layer deposition. The shown planar surface of material 120 can be formed by, for example, chemical-mechanical planarization.

The structure of FIG. 12 comprises islands of conductive material 120 surrounded by insulative material 110. In particular aspects, the islands can be of appropriate size and shape to function as quantum dots.

The processing of FIGS. 9–12 can be optional in particular aspects of the invention. In such aspects, the electrically insulative material 14 of FIG. 8 can be considered to be islands surrounded by conductive material 104, and in particular aspects can be formed to have an appropriate size and shape to be utilized as quantum anti-dots.

The processing of FIGS. 9–12 is one exemplary method for reversing the relative conductivities associated with first defined regions 105 and second defined regions 107, and specifically for converting the insulative material of first region 105 to conductive material, and converting the conductive material of surrounding second region 107 to electrically insulative material. An alternative process to accomplish the same end result is to first selectively replace the insulative material 14 associated with first region 105 in FIG. 8 with a conductive material, and subsequently replace conductive material 104 of second region 107 in FIG. 8 with an insulative material.

Figure 6:
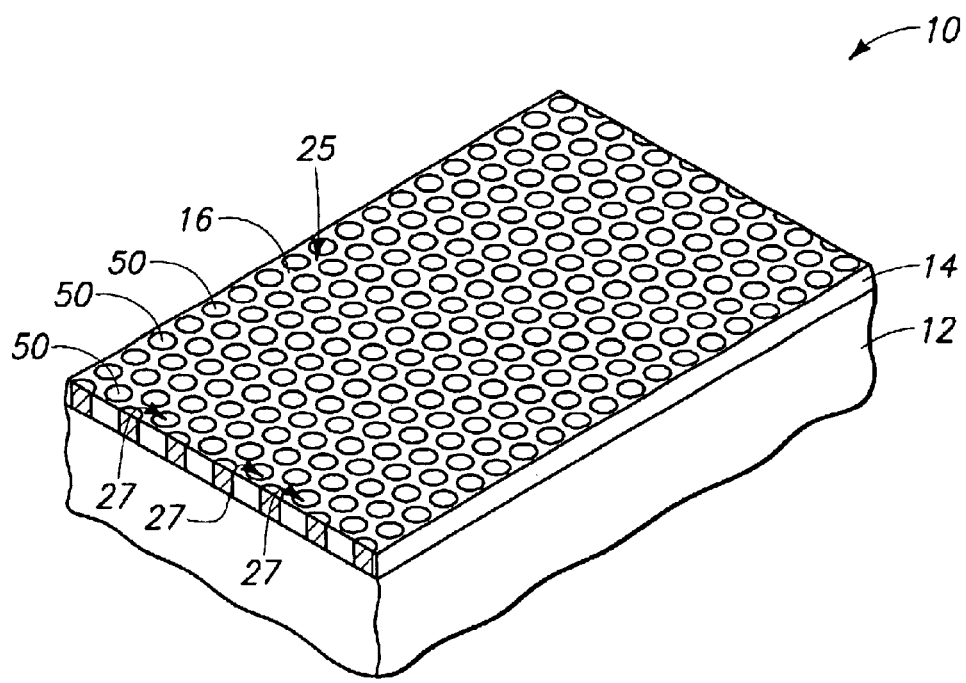
FIG. 6 is a view of the FIG. 1 wafer fragment shown at a processing stage subsequent to that of FIG. 5.

The constructions of FIGS. 6 and 12 can be incorporated into various circuit devices, with the conductive islands (50 of FIG. 6 and 120 of FIG. 12) being incorporated as quantum dots; and the construction of FIG. 8 can be incorporated into a circuit device with the islands of insulative material 14 being incorporated into quantum anti-dots. Constructions of the present invention can be utilized for other circuit devices in addition to, or alternatively to, quantum dots and anti-dots. For instance, the conductive islands (50 of FIG. 6, and 120 of FIG. 12) can be incorporated into vertical capacitor constructions, vertical transistor gates, etc.

Methodology of the present invention can be utilized in many applications in which it is desired to form small electrically conductive islands in an ordered fashion, such as, for example, applications for forming quantum transistors, quantum dot memory devices, quantum logic devices, nitride-based UV light emitters, etc. The invention can have particular application for forming devices which are too small to be formed utilizing photolithographic processing, or other processing relying on a photosensitive mask, including, for example, processes in which small islands, clusters, or other features are to be formed to be less than several angstroms in dimension.

In particular aspects, the present invention can be considered to utilize a chemical exchange reaction (for example, an exchange reaction between $WF_6$ gas and amorphous $Ta_2O_5$ dielectric film) for forming structures suitable for utilization as quantum dots or clusters. The utilization of localized crystallization of a suitable film, followed by a chemical exchange reaction selective for amorphous regions of the film relative to crystallized regions of the film, allows ordered structures to be formed utilizing the film. The formation of crystalline and amorphous phases of a given material on a common substrate, and subsequent selective replacement of the amorphous phases relative to the crystalline phases can be useful in a number of applications, in addition to those specifically described above.

In the chemistries described above, it is indicated that a metal-containing gas only interacts with amorphous regions of a given material, and not with crystalline regions of a material. If it is found that in some applications the metal-containing gas interacts with the crystalline regions to some extent, albeit more slowly than with the amorphous regions, various strategies can be utilized to compensate for effects caused by interaction of the metal-containing gas with the crystalline material. For instance, if a metal of the metal-containing gas deposits over the crystalline material, such metal can be removed by, for example, chemical-mechanical polishing in various aspects of the invention.

A specific advantage of particular aspects of the invention is that lithography and conventional etch processes can be eliminated during formation of patterned structures over a substrate.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its form or modifications within the proper scope of the appended claims appropriately interpretend in accordance with the doctrine of equivalents.

The invention claimed is:

1. A method of forming regions of differing composition over a substrate, comprising:
   forming a material over a substrate and forming a pattern of at least one substantially amorphous region and at least one substantially crystalline region within the material, the material having a first composition; the at least one substantially crystalline region defining at least one first region over the substrate, and the at least one substantially amorphous region defining at least one second region over the substrate; and
   selectively replacing the at least one substantially amorphous region of the material relative to the at least one substantially crystalline region of the material; the at least one substantially amorphous region of the material being selectively replaced with a second composition which is different from the first composition; after the selective replacing, the at least one first region having the first composition and the at least one second region having the second composition.

2. The method of claim 1 wherein the substrate is a semiconductor substrate.

3. The method of claim 1 wherein:
   the first composition is electrically insulative; and
   the second composition is electrically conductive.

4. The method of claim 3 wherein there are a plurality of first regions and wherein at least some of the first regions are islands of the electrically insulative first composition surrounded by the electrically conductive second composition and correspond to quantum anti-dots.

5. The method of claim 3 wherein there are a plurality of second regions and wherein at least some of the second regions are islands of the electrically conductive first composition surrounded by the electrically insulative second composition and correspond to quantum dots.

6. The method of claim 1 wherein:
   there are a plurality of the first regions and a plurality of the second regions;
   at least some of the first regions are formed as rings and at least some of the second regions are islands surrounded by the rings;
   the first composition is electrically insulative; and
   the second composition is electrically conductive.

7. The method of claim 6 wherein the islands of second composition within the rings correspond to quantum dot structures.

8. The method of claim 6 wherein the rings are in a closest packed configuration.

9. The method of claim 1 wherein the forming the pattern of at least one substantially amorphous region and at least one substantially crystalline region comprises exposing a portion of the material to laser-emitted light while leaving another portion not exposed to the laser-emitted light.

10. The method of claim 1 wherein the forming the pattern of at least one substantially amorphous region and at least one substantially crystalline region comprises heating portion of the material more than another portion.

11. The method of claim 1 wherein the forming the pattern of at least one substantially amorphous region and at least one substantially crystalline region comprises exposing a portion of the material to a heated structure while leaving another portion not exposed to the heated structure.

12. The method of claim 11 wherein the heated structure is an atomic force microscope tip.

13. The method of claim 11 wherein the heated structure comprises a tip shaped as a ring, and forms a plurality of the first regions as rings.

14. The method of claim 1 wherein:
   the first composition consists essentially of tantalum pentoxide, tantalum nitride or aluminum oxide; and
   the selective replacing comprises exposing the at least one substantially amorphous region and the at least one substantially crystalline region to a tungsten-containing compound or a titanium-containing compound.

15. The method of claim 14 wherein the first composition consists essentially of tantalum pentoxide, and wherein the selective replacing comprises exposing the at least one substantially amorphous region and the at least one substantially crystalline region to the tungsten-containing compound, and wherein the tungsten-containing compound is $WF_6$.

16. The method of claim 14 wherein the first composition consists essentially of tantalum pentoxide, and wherein the selective replacing comprises exposing the at least one substantially amorphous region and the at least one substantially crystalline region to the titanium-containing compound, and wherein the titanium-containing compound is $TiCl_4$.

17. The method of claim 14 wherein the first composition consists essentially of tantalum nitride, and wherein the selective replacing comprises exposing the at least one substantially amorphous region and the at least one substantially crystalline region to the tungsten-containing compound, and wherein the tungsten-containing compound is $WF_6$.

18. The method of claim 14 wherein the first composition consists essentially of tantalum nitride, and wherein the selective replacing comprises exposing the at least one substantially amorphous region and the at least one substantially crystalline region to the titanium-containing compound, and wherein the titanium-containing compound is $TiCl_4$.

19. The method of claim 14 wherein the first composition consists essentially of aluminum oxide, and wherein the selective replacing comprises exposing the at least one substantially amorphous region and the at least one substantially crystalline region to the titanium-containing compound, and wherein the titanium-containing compound is $TiCl_4$.

20. The method of claim 1 wherein:
   the substantially amorphous form is selectively replaced relative to the substantially crystalline form;
   there are a plurality of the first regions and a plurality of the second regions;
   at least some of the first regions are formed as rings and at least some of the second regions are islands surrounded by the rings;
   some portions of-the first composition not comprised by the rings are also not contained within a ring but instead are between two or more adjacent rings; and said some portions of the first composition are converted from the substantially amorphous form to the substantially crystalline form prior to the selective replacement of the substantially amorphous form.

21. The method claim 20 wherein the first composition is electrically insulative and the second composition is electrically conductive.

22. A method of forming regions of differing composition over a substrate, comprising:

forming a substantially amorphous form of a material over a substrate;

subjecting the amorphous form of the material to a pattern of energy to pattern the material amongst at least one region remaining in the substantially amorphous form and at least one region in a substantially crystalline form, the at least one region having the substantially crystalline form being defined as at least one first region over the substrate, and the at least one region having the substantially amorphous form being defined as at least one second region over the substrate; and selectively replacing one of the substantially amorphous form and the substantially crystalline form relative to the other; a second composition being provided in place of the replaced form of the material; the second composition being different from the first composition in electrical conductivity.

23. The method of claim 22 wherein the subjecting the amorphous form of the material to the pattern of energy comprises rastoring a beam of the energy across the material in the pattern.

24. The method of claim 23 wherein the beam is laser-emitted light.

25. The method of claim 22 wherein the subjecting the amorphous form of the material to the pattern of energy comprises rastoring a heated tip across the material in the pattern.

26. The method of claim 22 wherein the subjecting the amorphous form of the material to the-pattern of energy comprises subjecting the material to a plurality of heated tips in the pattern.

27. The method of claim 22 wherein the first composition is electrically insulative and the second composition is electrically conductive.

28. The method of claim 22 wherein one of the first and second regions comprises islands surrounded by the other of the first and second regions, and wherein the island are formed to be quantum dots.

29. The method of claim 22 wherein one of the first and second regions comprises island surrounded by the other of the first and second region, and wherein the islands are formed to be quantum anti-dots.

30. A method of forming regions of differing composition over a substrate, comprising:

forming a substantially amorphous form of a material over a substrate, the material having, a first composition and being electrically insulative;

converting the substantially amorphous form to a substantially crystalline form at one or more locations of the material while leaving one or more other locations of the material in the substantially amorphous form, the one or more locations having the substantially crystalline form being defined as first regions over the substrate, and the one or more locations having the substantially amorphous form being defined as second regions over the substrate;

selectively replacing the substantially amorphous form of the material relative to the substantially crystalline form of the material; the substantially amorphous form of the material being selectively replaced with a second composition which is different from the first composition and which is electrically conductive; thus, after the selective replacing, the first regions have the first electrically insulative composition and the second regions have the second electrically conductive composition; and replacing the first and second compositions with third and fourth compositions, respectively; the third composition being electrically conductive and the fourth composition being electrically insulative; thus, after the replacing, the first regions have electrically conductive material and the second regions have electrically insulative material.

31. The method of claim 30 wherein at least some of the electrically conductive third composition of the first regions is in the form of islands surrounded by the electrically insulative fourth composition of the second regions, and wherein at least some of the islands are quantum dots.

32. The method of claim 30 wherein the substrate is a semiconductor substrate.

33. The method of claim 30 wherein the converting the substantially amorphous form to the substantially crystalline form comprises exposing the substantially amorphous form to laser-emitted light.

34. The method of claim 30 wherein the converting the substantially amorphous form to the substantially crystalline form comprises exposing the substantially amorphous form to a heated structure.

35. The method of claim 34 wherein the heated structure is an atomic force microscope tip.

36. The method of claim 30 wherein:

the first composition consists essentially of tantalum pentoxide or aluminum oxide; and the selective replacing comprises exposing the substantially amorphous regions and substantially crystalline regions to a tungsten-containing compound or a titanium-containing compound.

37. The method of claim 36 wherein the first composition consists essentially of tantalum pentoxide, and wherein the selective replacing comprises exposing the substantially amorphous regions and substantially crystalline regions to the tungsten-containing compound, and wherein the tungsten-containing compound is $WF_6$.

38. The method of claim 36 wherein the first composition consists essentially of tantalum pentoxide, and wherein the selective replacing comprises exposing the substantially amorphous regions and substantially crystalline regions to the titanium-containing compound, and wherein the titanium-containing compound is $TiCl_4$.

39. The method of claim 36 wherein the first composition consists essentially of aluminum oxide, and wherein the selective replacing comprises exposing the substantially amorphous regions and substantially crystalline regions to the titanium-containing compound, and wherein the titanium-containing compound is $TiCl_4$.

* * * * *

UNITED STATES PATENT AND TRADEMARK OFFICE
CERTIFICATE OF CORRECTION

PATENT NO. : 6,780,766 B2
DATED : August 24, 2004
INVENTOR(S) : Basceri et al.

It is certified that error appears in the above-identified patent and that said Letters Patent is hereby corrected as shown below:

Column 3,
Line 13, replace "pattering" with -- patterning --.
Line 63, replace "5↑ to about 500↑" with -- 5Å to about 500Å --.

Column 7,
Line 14, replace "an" with -- in --.

Column 11,
Line 5, insert -- of -- after "method".
Lines 47 and 50, replace "island" with -- islands --.
Line 51, replace "region" with -- regions --.
Line 56, replace "having," with -- having --.

Signed and Sealed this

Fifth Day of April, 2005

JON W. DUDAS
*Director of the United States Patent and Trademark Office*